United States Patent [19]

Shigaki et al.

[11] Patent Number: 5,550,878
[45] Date of Patent: Aug. 27, 1996

[54] PHASE COMPARATOR

[75] Inventors: Seiichiro Shigaki; Hiroaki Shimizu; Hiroyuki Mizomoto, all of Tokyo, Japan

[73] Assignee: NEC Corporation, Japan

[21] Appl. No.: 336,846

[22] Filed: Nov. 9, 1994

[30] Foreign Application Priority Data

Nov. 9, 1993 [JP] Japan .................... 5-278778

[51] Int. Cl.⁶ ..................................... H03D 3/24
[52] U.S. Cl. .................. 375/373; 375/375; 375/376; 331/18; 331/25
[58] Field of Search .................. 375/373, 375, 375/376; 331/1 A, 1 R, 18, 25; 327/141, 155, 156, 159, 161, 163

[56] References Cited

U.S. PATENT DOCUMENTS

| | | | |
|---|---|---|---|
| 3,980,820 | 9/1976 | Niemi et al. | 375/373 |
| 4,644,567 | 2/1987 | Artun et al. | 375/373 |
| 4,789,996 | 12/1988 | Butcher | 375/373 |

OTHER PUBLICATIONS

Nikkei Electronics 1989. 2. 20, No. 467, pp. 330–332.

*Primary Examiner*—Stephen Chin
*Assistant Examiner*—Huong Luu
*Attorney, Agent, or Firm*—Ostrolenk, Faber, Gerb & Soffen, LLP

[57] ABSTRACT

A phase comparator, a loop filter and a VCO compose a PLL. In the phase comparator, a CMI code defined by a CMI data is synchronized with a VCO clock generated in the VCO and an inverted clock of the VCO clock, respectively, to provide first and second synchronized CMI codes. The first synchronized CMI code is delayed to provide a delayed CMI code by a predetermined time dependent on a period of the VCO clock. The first and second synchronized CMI codes are subject to an exclusive OR logic calculation, thereby generating a phase difference signal. The delayed CMI code and the first synchronized CMI code are subject to an exclusive OR logic calculation, and a result of this exclusive OR logic calculation and the VCO clock are subject to an AND logic calculation to provide an enable signal. Only when the enable signal is high, the phase difference signal is sampled to be used as a phase difference signal in the PLL.

4 Claims, 3 Drawing Sheets

PHASE COMPARATOR

FIELD OF THE INVENTION

The invention relates to a phase comparator, and more particularly to, a phase comparator for comparing phases of a CMI (coded mark inversion) code and a VCO (voltage controlled oscillator) clock in a PLL (phase-locked loop) which is composed of the phase comparator, a low-pass filter and a VCO.

BACKGROUND OF THE INVENTION

A CMI code is a code in which data "0" is represented by "01", and data "1" is represented by "00" and "11" alternately used, wherein each bit of the codes "01", "00" and "11" is allocated to a period which is defined by dividing a time slot by two.

In a method for sampling a clock included in a CMI code to detect a phase difference between a VCO clock and the CMI code, a ceramic filter is used. However, this method has disadvantages in that size can not be small, and cost can not be reduced. For these disadvantages, a PLL circuit is proposed to be realized in an integrated circuit including a phase comparator, a loop filter and a VCO. In the PLL circuit, the phase comparator comprises an edge detecting circuit for detecting rise-up and fall-down of a CMI clock to provide a pulse signal, a first D-flip flop for providing two complementary signals each having a pulse width equal to a period of a VCO clock by receiving the VCO clock a second D-flip flop for providing a phase signal of the CMI code by receiving the pulse signal and one of the two complementary signal, and an exclusive OR gate for providing a phase difference signal in accordance with an exclusive OR logic calculation between the phase signal of the CMI code and the remaining one of the two complementary signal which is a phase signal of the VCO clock.

In the PLL circuit, the phase difference signal which is obtained from the exclusive OR circuit is supplied to the low-pass filter, from which a controlled DC voltage is applied to the VCO, so that a frequency of the VCO clock is controlled dependently on a level of the controlled DC voltage.

However, the phase comparator has a disadvantage in that the phase difference signal is not obtained on condition that the CMI code is of "00" and "11" to express CMI data "1" and "1", because the signal of rise-up and fall-down of the CMI code has a period equal to two periods of the VCO clock, thereby resulting that the phase signal of the CMI code is kept to be high for the duration of the CMI data "1", that is, the CMI code "00" and "11". Consequently, a loop gain is lowered to increase jitter. As a matter of course, no generation of a phase difference signal results in the stepping out of synchronism. Further, there are disadvantages in that a precision is required for a relation between a phase difference and a pulse width of a phase difference signal, because the phase difference is converted to the pulse width of the phase difference signal, and in that jitter occurs, when noise is superposed on the phase difference signal to change the pulse width of the phase difference signal.

SUMMARY OF THE INVENTION

Accordingly, it is an object of the invention to provide a phase comparator in which phases of a CMI code and a VCO clock can be compared by a simple circuit structure, even if the CMI code is at a consecutive state of "00" and "11".

It is a further object of the invention to provide a phase comparator providing no jitter in a PLL circuit.

It is a still further object of the invention to provide a phase comparator providing no stepping-out of synchronism.

It is a yet still further object of the invention to provide a phase comparator in which a precision is not required for a relation between a phase difference and a pulse width of a phase difference signal.

According to the invention, a phase comparator, comprises:

means for providing a phase signal of a CMI code relative to a VCO clock by receiving a CMI code, the VCO clock and a delayed code which is obtained by delaying the CMI code by a predetermined time based on a period of the VCO clock, the CMI code having a row of bits comprising "01", "00" and "11" dependent on CMI data "0" and "1", and the VCO clock having the period for defining a time slot for a bit of the CMI data, the VCO clock being generated in a VCO which is applied with a controlled voltage by a loop filter, the phase comparator, the VCO and the loop filter compose a PLL;

means for providing an enable signal by receiving the CMI code and the VCO clock, the enable signal being generated at least in two time slots; and means for providing a phase difference signal between the CMI code and the VCO clock by receiving the phase signal, when the enable signal is generated.

BRIEF DESCRIPTION OF THE DRAWINGS

The invention will be explained in more detail in conjunction with appended drawings, wherein.

DESCRIPTION OF THE PREFERRED EMBODIMENTS

Before describing in a preferred embodiment according to the invention, the aforementioned conventional phase comparator will be explained in FIGS. 1 and 2.

Figure 1:
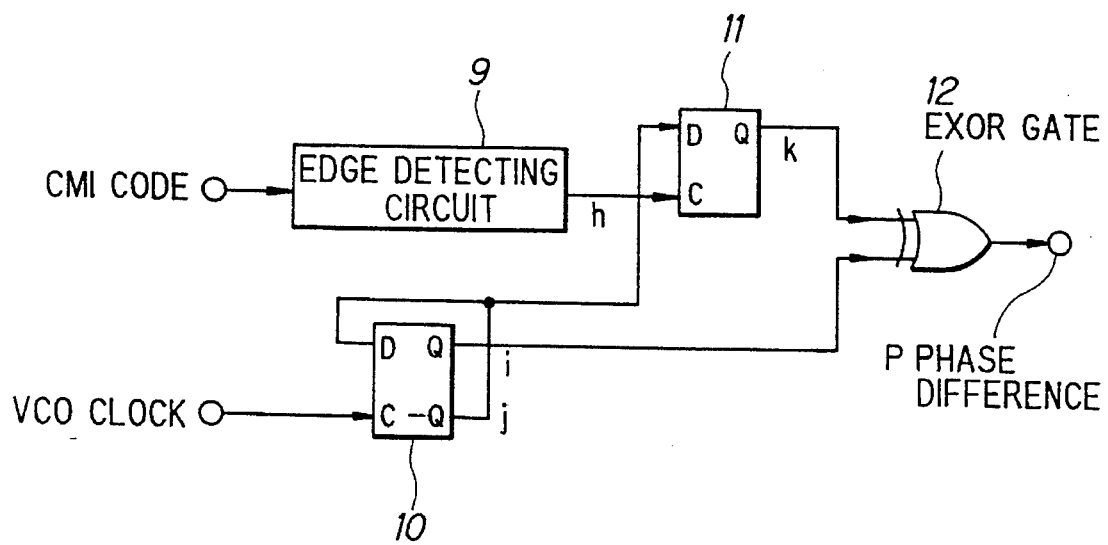
FIG. 1 is a block diagram showing a conventional phase comparator.

FIG. 1 shows the conventional phase comparator which comprises an edge detecting circuit 9 for providing a pulse h having a fine width at timing of rise-up and fall-down of a CMI (coded mark invention) code, a D-flip flop 10 for providing outputs, j and i by dividing a VCO (voltage controlled oscillator) clock by two, a D-flip flop 11 for providing an output k by receiving the output h at an input c and the output j at an input D, and an exclusive OR circuit 12 for providing a phase-comparated output p by receiving the outputs k and i.

In this conventional phase comparator, the edge detecting circuit 9 may be composed of a delay circuit and an exclusive OR circuit, wherein a pulse having a width proportional to a delay time of the delay circuit is generated, when an exclusive OR logic calculation is carried out in the exclusive OR circuit between an input signal and a delayed signal of the input signal.

Figure 2:
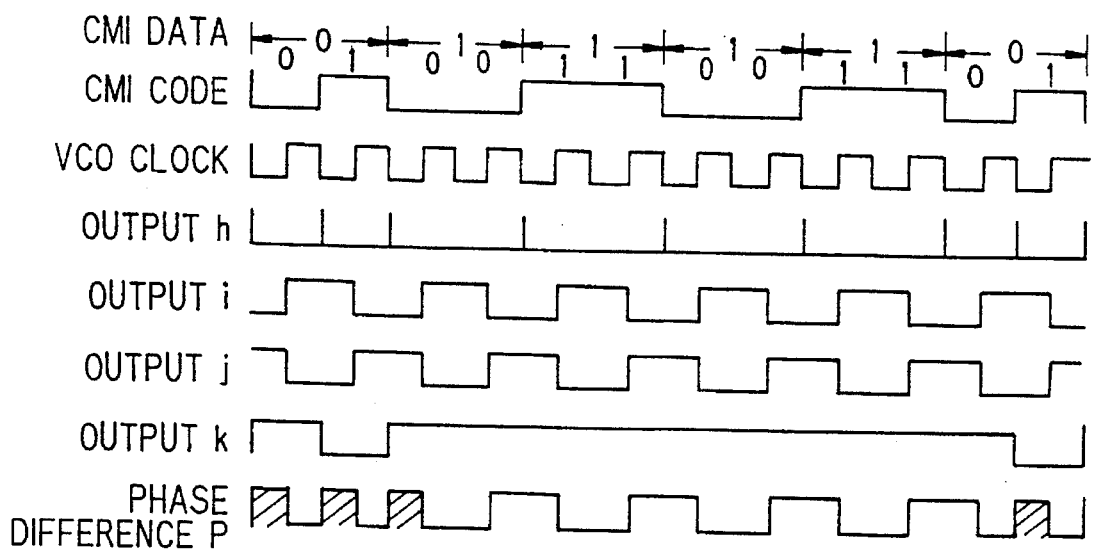
FIG. 2 is a timing chart showing operation in the conventional phase comparator.

FIG. 2 shows signals at timing in the phase comparator as shown in FIG. 1. As clearly shown therein, the CMI code has a row of bits comprising "01" for data "0", "00", "11" and "00" for data "1", and "01" for data "0", and the output h of the edge detecting circuit 9 is a pulse generated at the timing of rise-up and fall-down of the CMI code. The outputs i and j of the D-flip flop 10 are obtained by dividing the VCO clock by two, and the output k of the D-flip flop 11 is obtained by latching the output j of the D-flip flop 10 at timing of the output h. The outputs h and k include information of a phase for the CMI code, and the outputs i and j include information of a phase for the VCO clock, so that a phase difference p between the CMI code and the VCO clock is obtained at the output of the exclusive OR circuit 12 to have a width marked by hatching.

In this phase comparator, when the CMI code is of bits "00" and "11", the output k of the edge detecting circuit 9 is half in period relative to the VCO clock, so that the D-flip flop 11 is supplied with the output j of "high" at timing of the output h to constantly provide the output k of "high". This means that no information of the CMI code is generated, but information of the VCO clock is only generated, when the CMI code is of bits "00" and "11", namely, the data "1" continues.

Next, a phase comparator in the preferred embodiment according to the invention will be explained in FIGS. 3 and 4.

Figure 3:
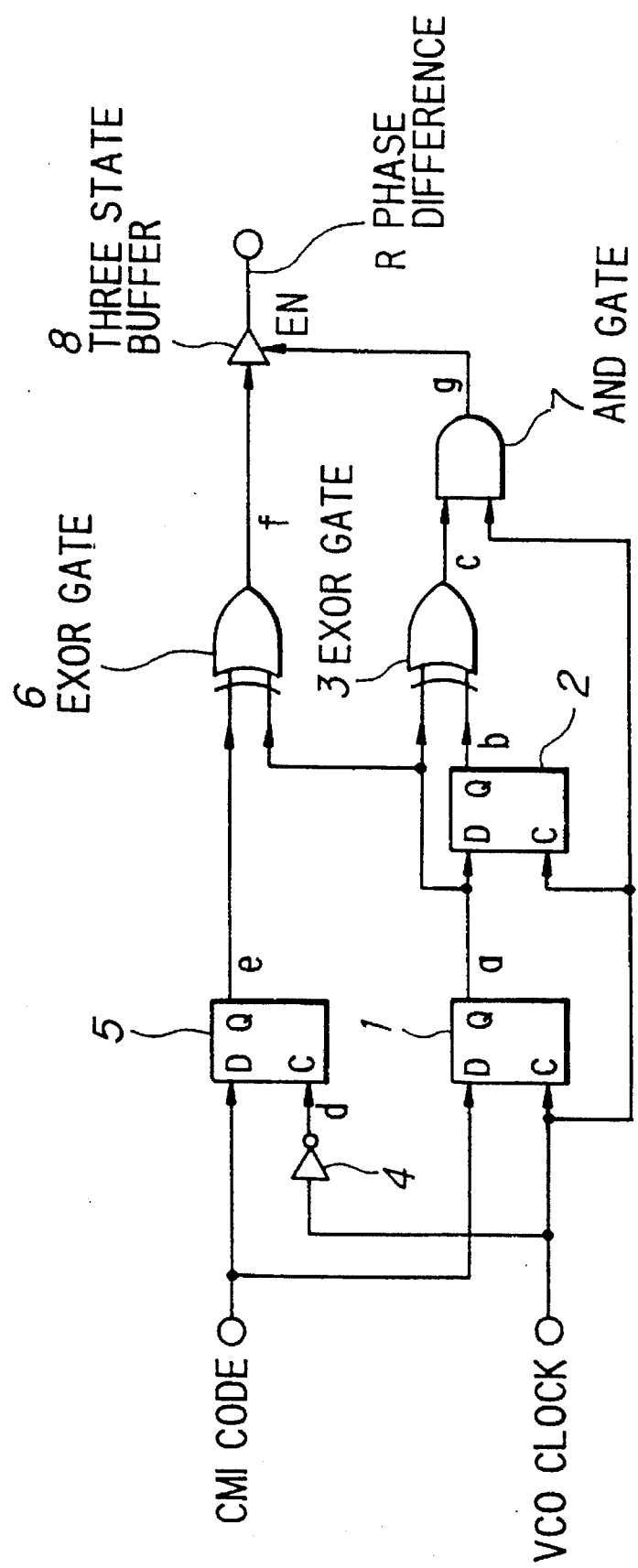
FIG. 3 is a block diagram showing a phase comparator in a preferred embodiment according to the invention.

In FIG. 3, the phase comparator comprises a first D-flip flop 1 for receiving a CMI code which is latched by a VCO clock, a second D-flip flop 2 for delaying an output a of the D-flip flop 1 by one clock by using the VCO clock, a first exclusive OR gate 3 for carrying out an exclusive OR logic calculation between the output a of the D-flip flop 1 and an output b of the D-flip flop 2, an inverter 4 for providing an inverted output d of the VCO clock, a third D-flip flop 5 for receiving the CMI code at timing of the inverted output d to provide an output e, a second exclusive OR gate 6 for carrying out an exclusive OR logic calculation between the output a of the D-flip flop 1 and the output e of the D-flip flop, an AND gate 7 for carrying out an AND logic calculation between an output c of the first exclusive OR gate 3 and the VCO clock, and a three-state buffer 8 for providing first to third states in which a phase comparated output R having the first and second states obtained from an output f of the second exclusive OR gate 6 by receiving an output g of the AND gate 7 as an enable signal.

In operation, the first D-flip flop 1 is supplied at a D-input terminal with the CMI code and at a C-input terminal with the VCO clock to provide the CMI code which is synchronized with the VCO clock at a Q-output terminal as an output a. Then, the second D-flip flop 2 is supplied at a D-input terminal with the output of the first D-flip flop and at a C-input terminal with the VCO clock to provide the CMI code which is delayed by one clock at a Q-output terminal as an output b. Then, the first exclusive OR gate 3 carries out an exclusive OR logic calculation between the output a of the first D-flip flop 1 and the output b of the second D-flip flop 2 to provide an output c. On the other hand, the third D-flip flop 5 is supplied at a D-input terminal with the CMI code and at a C-input terminal with the inverted output d of the inverter 4 which is an inverted VCO clock to provide the CMI code which is delayed by one clock at a Q-output terminal as an output e. Then, the second exclusive OR gate 6 carries out an exclusive OR logic calculation between the output a of the first D-flip flop 1 and the output e of the third D-flip flop 5 to provide an output f, and the AND gate 7 provides an output g as a result of an AND logic calculation between the output c of the first exclusive OR circuit 3 and the VCO clock. Finally, the three state buffer 8 provides a phase comparated output R having the two states, when it receives "1" at the enable terminal EN from the AND gate 7, and represents a high impedance state, when it receives "0" at the enable terminal EN from the AND gate 7.

Figure 4:
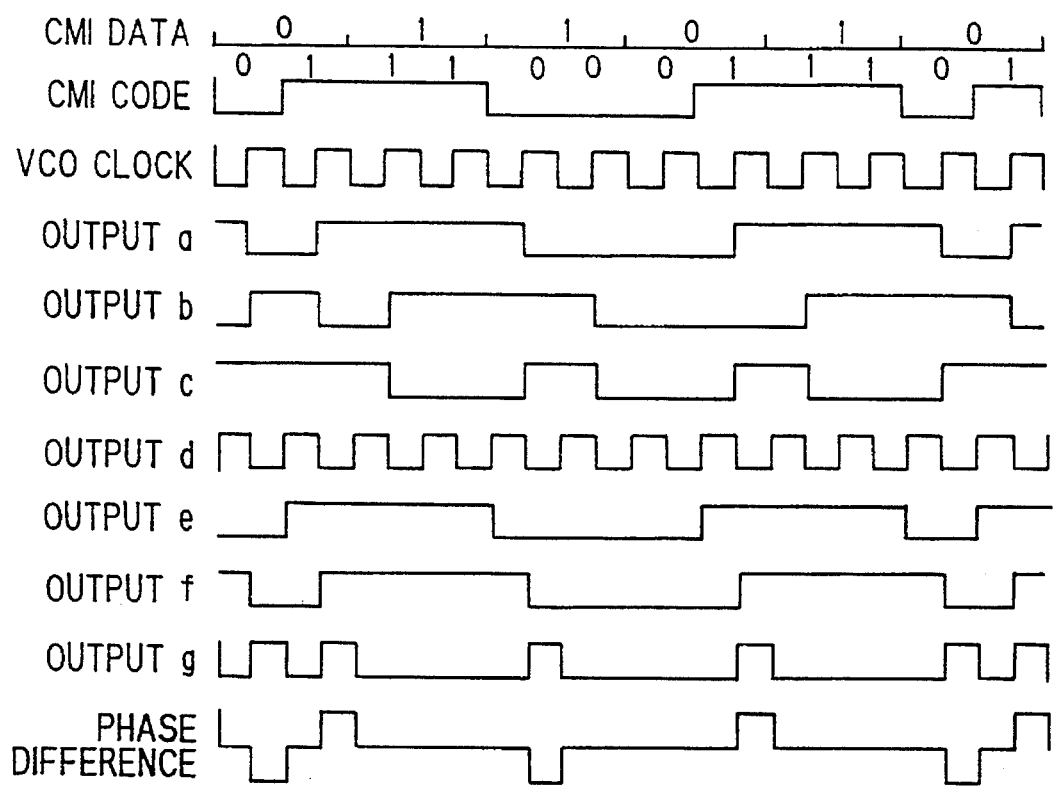
FIG. 4 is a timing chart showing operation in the phase comparator in the preferred embodiment.

FIG. 4 shows signals at timing in the phase comparator as shown in FIG. 3, wherein it is assumed that CMI data is of "011010" which is represented by the CMI code having a row of bits "01", "11", "00", "01", "11" and "01", and the VCO clock is synchronized with each bit of the CMI code.

As clearly shown therein, the output a of the first D-flip flop 1 is synchronized with the VCO clock, and has a delay relative to the CMI code by half period of the VCO clock, and the output b of the second D-flip flop 2 has a delay relative to the output a by one period of the VCO clock. The output c of the first exclusive OR gate 3 is "1", when the outputs a and b are of a combination of "1" and "0", and "0", when the combination is of "1" and "1", or "0" and "0". The output e of the third D-flip flop 5 is "1" or "0" dependently on a state where the VCO clock leads or lags the CMI code in phase, and the output f of the second exclusive OR circuit 6 is "1", when the outputs a and e are of a combination of "1" and "0", and "0", when the combination is of "1" and "1", or "0" and "0". The output g of the AND gate 7 is supplied to the enable terminal EN of the three state buffer 8, so that the output f of the second exclusive OR gate 6 is passed through the three state buffer 8, when the output g is "1", and the three state buffer 8 provides a high impedance state, when the output g is "0". The output f of the second exclusive OR gate 6 which is passed through the three state buffer 8 is the phase difference signal R which takes three states, among which the first state is "1" (phase-lead) based on "1" of the output f, the second state is "0" (in phase) based on "0" of the output g, and the third state is "−1" (phase-lag) based on "0" of the output f.

As explained above, the CMI code is compared with the VCO clock at each logic value of the CMI code, so that the phase difference signal R is obtained at each period of the VCO clock, where one logic value of the CMI code is assigned to one period of the VCO clock, and one bit of the CMI data is expressed by two logic values of the CMI code.

In accordance with the invention, a phase difference signal is obtained, even if the CMI code is of "11" and "00" to define the CMI data "1", so that no setting-out of synchronism occurs, and no jitter is resulted.

Although the invention has been described with respect to specific embodiment for complete and clear disclosure, the appended claims are not to be thus limited but are to be construed as embodying all modification and alternative constructions that may be occur to one skilled in the art which fairly fall within the basic teaching here is set forth.

What is claimed is:

1. A phase comparator, comprising:

means providing phase signal of a coded mark inversion (CMI) code relative to a voltage controlled oscillator (VCO) clock by receiving said CMI code, said VCO clock and a delayed code which is obtained by delaying said CMI code by a predetermined time based on a period of said VCO clock, said CMI code having a row of bits comprising "01", "00" and "11" dependent on CMI data "0" and "1", and said VCO clock having said period for defining a time slot for a bit of said CMI data;

means providing an enable signal by receiving said CMI code and said VCO clock, said enable signal being generated at least in two time slots; and means providing a phase difference signal between said CMI code and said VCO clock by receiving said phase signal, when said enable signal is generated, said phase difference signal means having one output line on which a three state signal of said phase difference signal is provided.

2. A phase comparator, comprising:

a first flip flop for synchronizing a coded mark inversion (CMI) code with a voltage controlled oscillator (VCO) clock, said CMI code being defined by a CMI data and said VCO clock having a period for defining a time slot for said CMI data;

a second flip flop for delaying said CMI code supplied from said first flip flop by a predetermined time determined by said period of said VCO clock;

a first exclusive OR circuit for performing exclusive OR logic calculation between outputs of said first and second flip flops;

a third flip flop for adjusting a timing of said CMI code by a signal obtained by inverting said VCO clock;

a second exclusive OR circuit for performing exclusive OR logic calculation between outputs of said first and third flip flops, said second exclusive OR circuit providing a pulse signal representing a phase difference between said CMI code and said VCO clock;

an AND gate for performing AND logic calculation between an output of said first exclusive OR circuit and said VCO clock, said AND gate providing an enable signal having first and second logic states; and an output circuit for outputting said pulse signal supplied from said second exclusive OR circuit by receiving said first logic state of said enable signal, said output circuit having one output line on which a three state signal of said pulse signal is provided.

3. A phase comparator, according to claim 2, wherein:

said output circuit is a three state buffer to represent lead-and lag-phases of said CMI code relative to said VCO clock, when said enable signal is at said first logic state, and a high impedance state, when said enable signal is at said second logic state.

4. A phase comparator, according to claim 2, wherein:

each of said first to third flip flops is a D-flip flop.

* * * * *